United States Patent [19]

Gehrig et al.

[11] 4,216,391

[45] Aug. 5, 1980

[54] CIRCUIT ARRANGEMENT FOR GENERATING A BINARY-CODED PULSE TRAIN

[75] Inventors: Wilfried W. Gehrig, Freiburg; Joachim Grosse, Breisach-Gündlingen, both of Fed. Rep. of Germany

[73] Assignee: ITT Industries, Incorporated, New York, N.Y.

[21] Appl. No.: 955,835

[22] Filed: Oct. 30, 1978

[30] Foreign Application Priority Data

Dec. 24, 1977 [DE] Fed. Rep. of Germany ....... 2758012

[51] Int. Cl.[2] .......................... H03K 1/12; G08B 9/00

[52] U.S. Cl. .................................... 307/265; 307/203; 307/221 R; 328/58; 328/37

[58] Field of Search ............... 307/260, 265, 203, 210, 307/221 C; 328/111; 325/390

[56] References Cited

U.S. PATENT DOCUMENTS 3,693,098 9/1972 Sevilla .................................. 307/265

FOREIGN PATENT DOCUMENTS 1495370 12/1977 United Kingdom .

*Primary Examiner*—Stanley D. Miller, Jr.
*Assistant Examiner*—B. P. Davis
*Attorney, Agent, or Firm*—John T. O'Halloran; Peter C. Van Der Sluys

[57] ABSTRACT

A circuit arrangement for generating a pulse train having a predetermined first pulse spacing (a) and a second pulse spacing (b) differing from the first by an integral factor greater than one, which pulse spacings are assigned to the binary ZERO and the binary ONE, respectively, dependent upon a predetermined n-bit binary word.

4 Claims, 3 Drawing Figures

CIRCUIT ARRANGEMENT FOR GENERATING A BINARY-CODED PULSE TRAIN

BACKGROUND OF THE INVENTION

This invention relates in general to a circuit arrangement for generating a binary-coded pulse train, and more particularly to a circuit arrangement for generating a pulse train having a predetermined first pulse spacing (a) and a second pulse spacing (b) differing from the first by an integral factor greater than one, which pulse spacings are assigned to the binary ZERO and the binary ONE, respectively, dependent upon a predetermined n-bit binary word.

Binary-coded pulse trains are needed, for example, to transmit information by pulse-code modulation, where the binary-coded information lies in the different pulse spacings of the pulse train. A method known from German Published Patent Application (DT-OS) No. 2,503,083 assigns the binary ZERO to a first pulse spacing, and the binary ONE to a pulse spacing which is twice as large. Such a limitation is not necessary, however, in particular, the second pulse spacing may be an integral multiple of, i.e., m times, the first pulse spacing.

The method disclosed in the above German published patent application is used for infrared remote control of television sets. This specific use is not imperative, either. For example, phono equipment and radio sets can be remotely controlled in this manner, too. Even the specified assignment of the two binary state to the two pulse spacings can be reversed, as is described, for example, in applicant's prior German application No. P 27 37 467.0-32.

In the arrangement disclosed in that prior application, which also relates to a remote control arrangement using pulse-code modulation, each remote control command consists of an n-bit binary word which is generated by pressing the key of a keyboard and determines the position and spacing of the pulses of the transmitted pulse train.

SUMMARY OF THE INVENTION

An object of the present invention is to provide a circuit arrangement for generating a pulse train of the kind whose two pulse spacings differing by an integral factor are determined by the predetermined n-bit binary word.

Another object of the present invention is to provide a circuit arrangement for generating a pulse train having a predetermined first pulse spacing (a) and a second pulse spacing (b) differing from the first by an integral factor greater than one, which pulse spacings are assigned to the binary ZERO and the binary ONE, respectively, dependent upon a predetermined n-bit binary word, wherein an (n+1)-stage shift register, is provided for holding the binary word in the n first stages, a NOR gate having its first input is connected to a serial output of the shift register and an output connected to a shift-signal input of the shift register, a first inverter stage whose input is fed with a pulse train having a period (T) which is large compared to a pulse width (t) of the pulse train and practically equal to the first pulse spacing (a), and whose output is connected to a second input of the NOR gate, a second inverter stage having an input connected to the serial output of the shift register, and a delay stage whose delay is equal to the second pulse spacing (b), and whose input is connected to an output of second inverter stage and whose output is connected to a parallel input of the (n+1)th stage of the shift register.

The invention makes it possible to serially shift the binary word contained in or read into a shift register to the output of this shift register in such a manner that, dependent upon the binary states ZERO and ONE, a pulse train with a first pulse spacing is changed to a pulse train which has the pulse spacing greater by an integral factor at the desired points.

BRIEF DESCRIPTION OF THE DRAWINGS

The invention will now be explained in greater detail with reference to the accompanying drawings, in which.

DETAILED DESCRIPTION OF THE INVENTION

Figure 1:
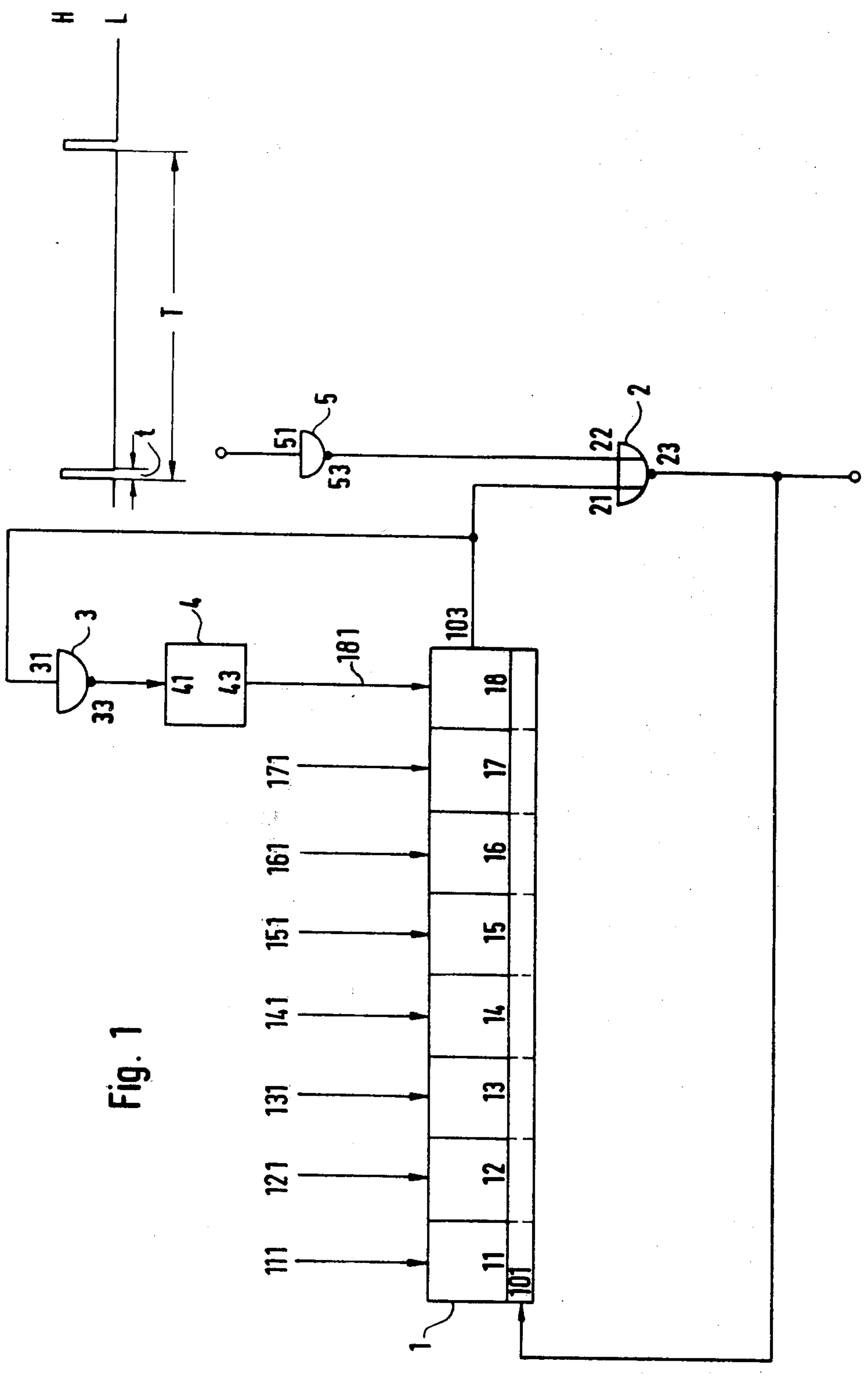
FIG. 1 is a block diagram of the circuit arrangement according to the invention.

In FIG. 1, the shift register 1 consists of n first stages 11, 12, 13, 14, 15, 16, 17, into which the n-bit binary word can be written in parallel via respective parallel inputs 111, 121, 131, 141, 151, 161, 171. According to the invention, however, the total number of stages of the shift register 1 is n+1, i.e., there is an additional stage 18.

The shift register's serial output 103, which is identical with the serial output of the (n30 1)th stage 18, is coupled to the first input 21 of the NOR gate 2 and to the input 31 of the inverter stage 3, whose output 33 is connected to the input 41 of the delay stage 4. The delay of the delay stage 4 is equal to the second pulse spacing b, which, in turn, is an integral multiple of the first pulse spacing a (b=m.a). In one embodiment by way of illustration, b is twice as large as a (b=2a; m=2). The output 43 of the delay stage 4 is coupled to the parallel input 181 of the (n+1)th stage 18 of the shift register 1.

The second input 22 of the NOR gate 2 is fed via the inverter 5 with a pulse train whose pulses have the width t and whose period T is large compared to the pulse width t, as can be seen from the schematic waveform shown in FIG. 1. The period T is practically equal to the first pulse spacing a, since, as mentioned above, the period T is large compared to the pulse width t.

The output 23 of the NOR gate 2 is coupled to the shift-pulse input 101 of the shift register 1 and simultaneously forms the output for the pulse train pulse-code-modulated according to the n-bit binary word.

Figure 2:
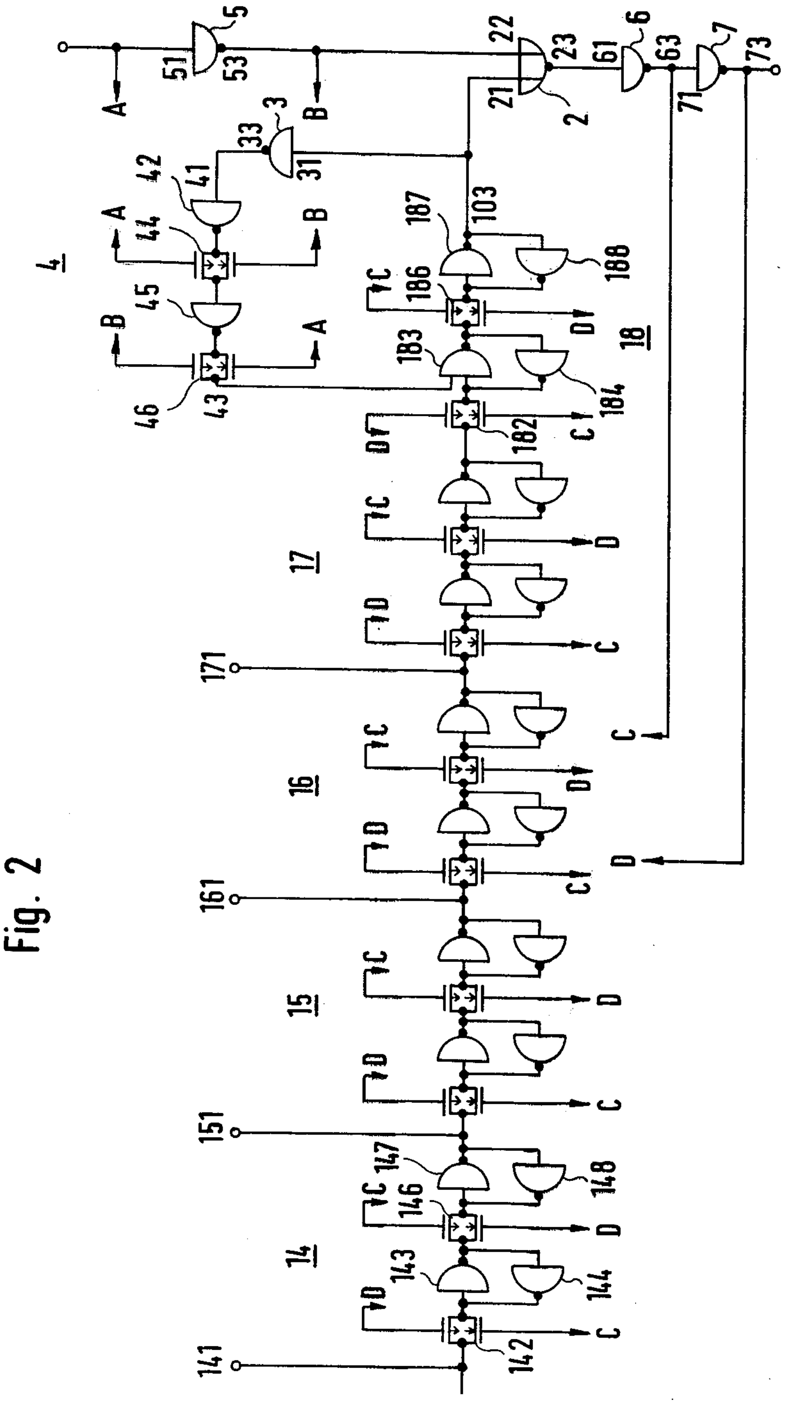
FIG. 2 is a schematic circuit diagram of a preferred embodiment using CMOS technology.

In the basic circuit diagram of a preferred embodiment, shown in FIG. 2, which is implemented using CMOS technology, i.e., the technology of complementary insulated-gate field-effect transistors, only the shift-register stages 14 to 18 of the stages 11 to 18 of FIG. 1 are shown for the sake of clarity. These stages are essentially of like design, which applies especially to the stages 14 . . . 17, so only the individual components of the stage 14 have been designated by reference characters. The stage 18, whose individual components are also designated by reference characters, has a minor peculiarity which will be considered in detail below.

The basic element of the aforementioned CMOS technology is the so-called CMOS inverter, which consists of two complementary insulated-gate field-effect transistors of the enhancement type which have their controlled current paths connected in series, and whose interconnected gates form the inverter input. The junction of the two controlled current paths is the inverter output, cf., for example, U.S. Pat. No. 3,356,858. To avoid having to draw such a complementary insulated-gate field-effect structure for each CMOS inverter in FIG. 2, only the known logic symbol for inverters is shown, namely, a semicircle with the inversion point at the output.

Another basic element of the aforementioned CMOS technology is the so-called transmission gate, cf. U.S. Pat. No. 3,457,435, which also consists of two complementary insulated-gate field-effect transistors which have their controlled current paths connected in parallel and at whose gates are applied control signals so that the two transistors can be biased on or off simultaneously. The transmission gate thus represents a controllable electronic switch for both directions of current, since, as is well known, field-effect transistors are symmetrical transistors.

These basic elements, i.e. the CMOS inverter and the CMOS transmission gate, form the individual shift-register stages of FIG. 2. For example, the shift-register stage 14, as viewed from its input 141, comprises the first CMOS transmission gate 142, the first CMOS inverter 143, the second CMOS transmission gate 146, and the second CMOS inverter 147. Each of the two CMOS inverters 143, 147 has an additional CMOS inverter connected in parallel such that the outputs of the first and second CMOS inverters are coupled to the inputs of the CMOS inverters 144 and 148, respectively, whose outputs are connected to the inputs of the associated first and second CMOS inverters 143 and 147, respectively. The two CMOS inverters 144, 148 are designed so that their output resistances are high. Thus, each of the two back-to-back CMOS inverters represents a static memory cell.

In each of the CMOS transmission gates shown in FIG. 2, the n-channel transistor is the upper one, and the p-channel transistor the lower one, of the two parallel-connected insulated-gate field-effect transistors, which is indicated by the respective substrate arrows.

In the preferred embodiment of FIG. 2, the delay stage 4 shown in FIG. 1 also consists of CMOS inverters and CMOS transmission gates in series, namely of the CMOS inverters 42, 45 and the CMOS transmission gates 44, 46, which are connected in series with respect to the signal flow, i.e., from the output 33 of the inverter stage 3 to the output 43 of the delay circuit 4.

The slight difference in the design of the stage 18 of the shift register 1 from that of the stages 14 . . . 17 consists in the fact that the CMOS inverter corresponding to the first CMOS inverter 143 in stage 14 is designed as a NAND gate 183 having one input connected to the preceding CMOS transmission gate 182, and the other to the output 43 of the delay stage 4. The other components are of the same design, i.e., the transmission gate 186 corresponds to the transmission gate 146, and the CMOS inverters 184, 187, 188 correspond to the CMOS inverters 144, 147, 148.

Since the shift register stages described require two mutually inverse or complementary clock signals to control the CMOS transmission gates, additional inverter stages are provided, namely the inverter stage 5 to drive the CMOS transmission gates 44, 46 of the delay stage 4, and the inverter stages 6, 7 to drive the CMOS transmission gates in the shift register stages. The pulse train applied to the second input 22 of the NOR gate 2 of FIG. 1 is fed in FIG. 2 to the input 51 of the above-mentioned additional inverter stage 5, whose output 51 provides the inverse pulse train, which is then applied to the input 22 of the NOR gate 2. The signals at the input 51 and at the output 53 of the inverter stage 5 are designated A and B, respectively, and are applied to the similarly designated gate electrodes of the CMOS transmission gates 44, 46.

The output 23 of the NOR gate 2 is coupled to the input 61 of the inverter stage 6, whose output 63 is connected to the input 71 of the inverter stage 7. The output 73 of the inverter stage 7 forms the output for the pulse train to be generated. The design of the inverter stage 7 is adapted to that of the inverter stage 6 because these two inverter stages must supply all gate electrodes of the CMOS transmission gates in the shift register 1 with clock signals. If the circuit connected to the output may also be operated from the output 23 of the NOR gate 2, this may also be done directly from this output. The output 63 of the inverter stage 6 provides a signal designated C, and the output 73 a signal designated D, which are applied to the similarly designated gate electrodes of the transmission gates of the shift register 1.

Figure 3:
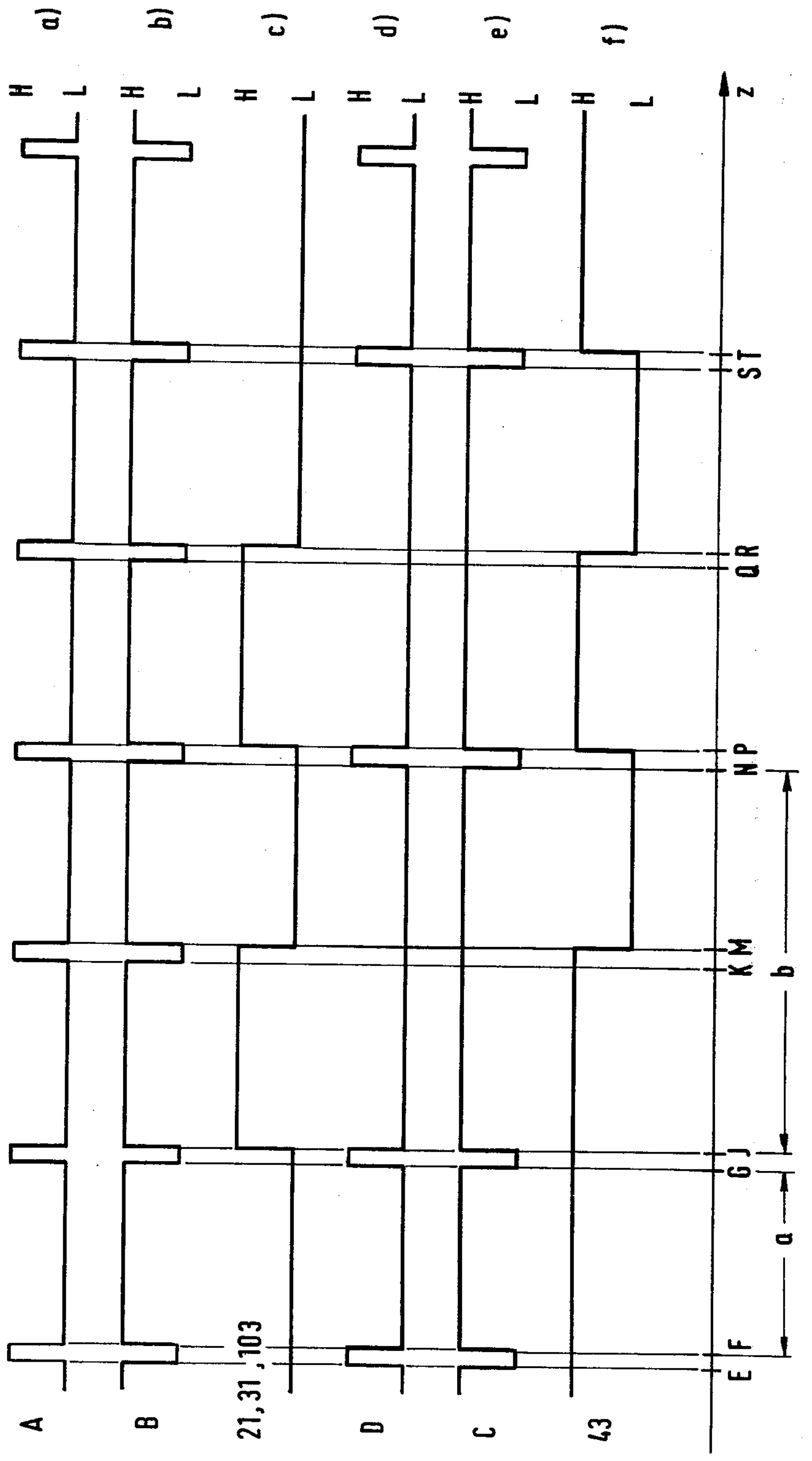
FIG. 3 shows various waveforms which occur during operation of the arrangement of FIG. 2.

FIG. 3 shows various waveforms as occur during operation of the arrangement of FIG. 2 and follow from the following description of the circuit's operation, it being assumed that the signal L, which is assigned to a low potential, corresponds to the binary ZERO, i.e., that positive logic is used. The signals shown in FIG. 3 are plotted against time, z, the characteristic instants being designated by the letters E . . . T.

The following description further assumes that the stages 14 . . . 17 of the shift register 1 contain the following binary signal: 0 1 1 0, which corresponds to the states L H H L in positive logic. Furthermore, it is assumed that the additional stage 18 of the shift register 1 contains a binary ZERO, i.e. an L signal, too. This means that, at the instant E in FIG. 3, the outputs of the stages 14 to 18 are at the respective H or L level.

Between the instants E and F, the first transmission gates 142 . . . 182 are turned on, so that all signal levels can pass through the first inverter stages 143/144 . . . 183/184 and reach the inputs of the second transmission gates 146 . . . 186. At the instant F, these signal levels are passed through the second transmission gates 146 . . . 186 and the second inverter stages 147/148 . . . 187/188 and appear at the outputs of the respective stages until the instant G.

The output 103 of the shift register 1 thus provides an L signal which is passed through the series-connected inverter stages 3, 42 and appears as an L signal at the input of the transmission gate 44, cf. FIG. 3c. This transmission gate 44 opens at the instant G and allows this L signal to pass to the inverter 45, which provides an H signal to the input of the transmission gate 46, from where it is applied to the second input of the NAND gate 183 at the instant J cf. FIG. 3f. At that instant, an H signal is also applied to the other input of this NAND gate, so an L signal appears at the output.

Furthermore, the L signal appearing at the output 103 of the shift register 1 at the instant G, together with the output signal B of the inverter stage 5, which is also at an L level at that instant, causes an H signal to appear at the output 23 of the NOR gate 2 which is changed to the signals C and D by the inverter stages 6 and 7, respectively, i.e. between the instants G and J, the two complementary or mutually inverse clock signals for the shift register 1 are formed, cf. FIGS. 3*d* and 3*e*.

In response to the clock pulses C, D occurring between the instants G, J, the H signal then appearing at the output of the stage 17 is entered into the stage 18 and reaches the output 103 at the instant J, cf. FIG. 3*c*. Thus, between the instants K and M, during which a B signal is again applied to the input 22, an L signal appears at the output 23 of the NOR gate 2, so no clock signals C, D are formed for the shift register 1 cf. FIGS. 3*d* and 3*e*.

On the other hand, the H signal at the output 103, after passing through the inverter stages 3, 42, 45 and the transmission gates 44, 46, causes an L signal to appear at the second input of the NAND gate 183 and at the output 103 of the shift register at the instant M. This L signal opens the NOR gate 2, which passes the B pulse applied to its input 22 at the instant N, so two inverse clock pulses C, D are again formed for the shift register 1.

At the instant N, the second H signal is transferred from the stage 17 to the stage 18. Between the instants N and Q, it again results in the just described correcting mechanism, so no clock pulses C, D are formed for the shift register 1 at the instant Q. It is not until the period between the instants S and T that clock pulses C, D are again fed to the shift register 1, because the last zero of the assumed binary word 0 1 1 0 reaches the output 103 at the instant S.

From the above description of the operation of the circuit arrangement, it is thus apparent that the clock signals C, D, of which the signal D is also the output signal of the circuit, have two different pulse spacings which have a ratio of about 1:2 and correspond to the binary word contained in the shift register 1.

While we have described above the principles of our invention in connection with specific apparatus it is to be clearly understood that this description is made only by way of example and not as a limitation to the scope of our invention as set forth in the objects thereof an in the accompanying claims.

We claim:

1. A circuit for generating a pulse train having a predetermined first pulse spacing (a) and a second pulse spacing (b) differing from the first by an integral factor greater than one, which pulse spacings are assigned to the binary ZERO and the binary ONE, respectively, dependent upon a predetermined n-bit binary word, comprising:

an (n+1)-stage shift register, said register holding the binary word in the n first stages;

a NOR gate having a first input connected to a serial output of said shift register and an output connected to a shift-signal input of said shift register;

a first inverter stage whose input is fed with a pulse train having a period (T) which is large compared to a pulse width (t) of the pulse train and practically equal to the first pulse spacing (a), and whose output is connected to a second input of said NOR gate;

a second inverter stage having an input connected to the serial output of said shift register; and a delay stage whose delay is equal to the second pulse spacing (b), and whose input is connected to an output of said second inverter stage and an output connected to a parallel input of the (n+1)th stage of said shift register.

2. The circuit arrangement as claimed in claim 1, wherein said shift register, said NOR gate, said first and second inverter and said delay stage are implemented using CMOS technology.

3. A circuit arrangement as claimed in claim 1 or 2 wherein said second pulse spacing is twice as large as said first pulse spacing.

4. A circuit for generating a pulse train having a predetermined first pulse spacing and a second pulse spacing differing from the first by an integral factor greater than one, which pulse spacings are assigned to the binary ZERO and the binary ONE respectively, comprising:

a shift register having (n+1) stages, a plurality of parallel inputs and a serial output, said register provided for holding the binary word in the n first stages of said shift register;

a NOR gate having a first input connected to the serial output of said register, a second input and an output connected to a shift signal input of said register;

a first inverter having an input fed with the pulse train having a period (T) large compared to a pulse width (t) of the pulse train and about equal to the first pulse spacing (a), and an output connected to the second input of said NOR gate;

a second inverter stage having an input connected to the signal output of said register; and a delay stage whose delay is equal to the second pulse spacing (b), and whose input is connected to an output of said second inverter stage and an output connected to the input of the (n+1)th stage of said register.

* * * * *